United States Patent
Stella et al.

(10) Patent No.: US 12,295,128 B2
(45) Date of Patent: May 6, 2025

(54) PACKAGED POWER ELECTRONIC DEVICE, IN PARTICULAR BRIDGE CIRCUIT COMPRISING POWER TRANSISTORS, AND ASSEMBLING PROCESS THEREOF

(71) Applicant: STMICROELECTRONICS S.r.l., Agrate Brianza (IT)

(72) Inventors: Cristiano Gianluca Stella, San Gregorio di Catania (IT); Francesco Salamone, Acireale (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 18/395,137

(22) Filed: Dec. 22, 2023

(65) Prior Publication Data

US 2024/0206133 A1 Jun. 20, 2024

Related U.S. Application Data

(62) Division of application No. 16/934,991, filed on Jul. 21, 2020, now Pat. No. 11,864,361.

(30) Foreign Application Priority Data

Aug. 1, 2019 (IT) .................. 102019000013743

(51) Int. Cl.
  *H05K 7/20* (2006.01)
  *H01L 23/373* (2006.01)
  *H01L 25/07* (2006.01)
(52) U.S. Cl.
  CPC ......... *H05K 7/209* (2013.01); *H01L 23/3735* (2013.01); *H01L 25/071* (2013.01)
(58) Field of Classification Search
  None
  See application file for complete search history.

(56) References Cited

U.S. PATENT DOCUMENTS

| 6,236,098 B1 | 5/2001 | Efland et al. |
| 6,697,257 B1 | 2/2004 | Wolf et al. |

(Continued)

FOREIGN PATENT DOCUMENTS

| CN | 1542957 A | 11/2004 |
| CN | 106486431 A | 3/2017 |

(Continued)

OTHER PUBLICATIONS

"ST Offer for Power Modules," Web Page <https://www.st.com/en/power-modules/stpower-acepack-modules.html#resource>, availability date Mar. 21, 2018, retrieval date Mar. 20, 2020, 22 pages.

(Continued)

*Primary Examiner* — Michelle Mandala
*Assistant Examiner* — Jordan M Klein
(74) *Attorney, Agent, or Firm* — Seed IP Law Group LLP

(57) ABSTRACT

The device has a first support element forming a first thermal dissipation surface and carrying a first power component; a second support element forming a second thermal dissipation surface and carrying a second power component, a first contacting element superimposed to the first power component; a second contacting element superimposed to the second power component; a plurality of leads electrically coupled with the power components through the first and/or the second support elements; and a thermally conductive body arranged between the first and the second contacting elements. The first and the second support elements and the first and the second contacting elements are formed by electrically insulating and thermally conductive multilayers.

20 Claims, 9 Drawing Sheets

(56) References Cited

U.S. PATENT DOCUMENTS

| | | |
|---|---|---|
| 9,986,361 B2 | 5/2018 | Chon et al. |
| 9,986,631 B2 | 5/2018 | Rizza et al. |
| 10,720,373 B2 | 7/2020 | Salamone et al. |
| 2005/0047186 A1 | 3/2005 | Gerbsch et al. |
| 2006/0151874 A1 | 7/2006 | Milich et al. |
| 2006/0163648 A1 | 7/2006 | Hauenstein et al. |
| 2006/0180916 A1 | 8/2006 | Wyland |
| 2007/0138651 A1 | 6/2007 | Hauenstein |
| 2007/0267739 A1 | 11/2007 | Kajiwara et al. |
| 2007/0290311 A1 | 12/2007 | Hauenstein |
| 2008/0054439 A1 | 3/2008 | Malhan et al. |
| 2009/0102067 A1 | 4/2009 | Wyland |
| 2009/0166850 A1 | 7/2009 | Jeon et al. |
| 2010/0133670 A1 | 6/2010 | Liu et al. |
| 2010/0164078 A1 | 7/2010 | Madrid et al. |
| 2011/0037166 A1* | 2/2011 | Ikeda ................. H01L 24/73 257/E23.101 |
| 2011/0132431 A1 | 6/2011 | Linderman et al. |
| 2012/0104580 A1 | 5/2012 | Feng et al. |
| 2013/0020694 A1* | 1/2013 | Liang .................. H01L 23/473 257/691 |
| 2013/0307156 A1 | 11/2013 | Bayerer |
| 2014/0159212 A1 | 6/2014 | Hung et al. |
| 2014/0246783 A1 | 9/2014 | Nishizawa et al. |
| 2015/0255380 A1 | 9/2015 | Chen |
| 2015/0311144 A1 | 10/2015 | Williams et al. |
| 2015/0380384 A1 | 12/2015 | Williams et al. |
| 2016/0005675 A1 | 1/2016 | Tong |
| 2016/0064308 A1* | 3/2016 | Yamada ................ H01L 25/04 257/697 |
| 2016/0204046 A1 | 7/2016 | Iwashige |
| 2017/0236782 A1 | 8/2017 | Nonaka |
| 2018/0040593 A1 | 2/2018 | Zhou et al. |
| 2018/0138136 A1 | 5/2018 | Tonegawa |
| 2018/0233424 A1 | 8/2018 | Sung et al. |
| 2019/0088594 A1 | 3/2019 | Ikeda et al. |
| 2019/0109225 A1 | 4/2019 | Russo et al. |
| 2019/0311976 A1 | 10/2019 | Salamone et al. |
| 2020/0303278 A1 | 9/2020 | Salamone et al. |
| 2021/0037674 A1 | 2/2021 | Stella et al. |
| 2021/0125914 A1* | 4/2021 | Harazono ............... H02M 7/48 |
| 2022/0157767 A1 | 5/2022 | Tanaka |
| 2023/0317685 A1 | 10/2023 | Stella |

FOREIGN PATENT DOCUMENTS

| | | |
|---|---|---|
| DE | 102013210146 A1 | 12/2014 |
| DE | 112019007349 T5 | 2/2022 |
| EP | 3370332 A1 | 9/2018 |
| EP | 3780100 A1 | 2/2021 |
| FR | 2 786 657 A1 | 6/2000 |
| JP | 2014067897 A | 4/2014 |
| JP | 2016167503 A | 9/2016 |

OTHER PUBLICATIONS

Xiao-Dong et al., "Packaging Structure and Technology of Power Electronic Module," Electronics & Packaging, vol. 9 No. 11, China Academic Journal Electronic Publishing House, 7 pages.

* cited by examiner

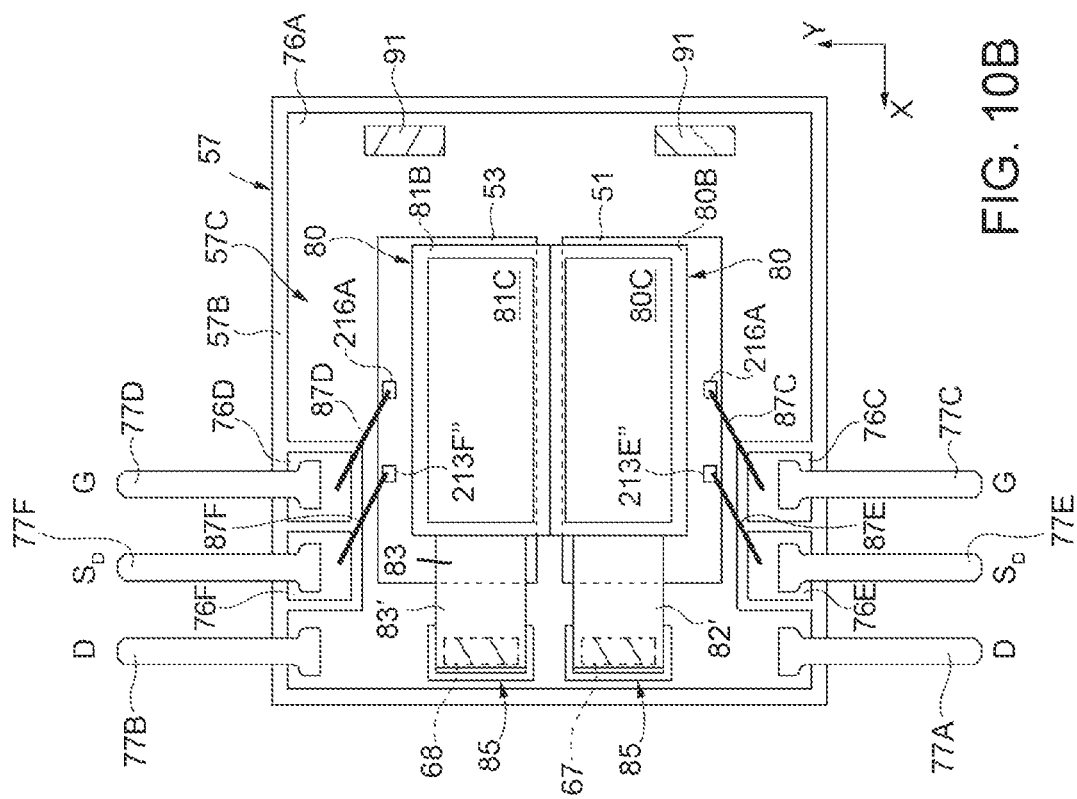
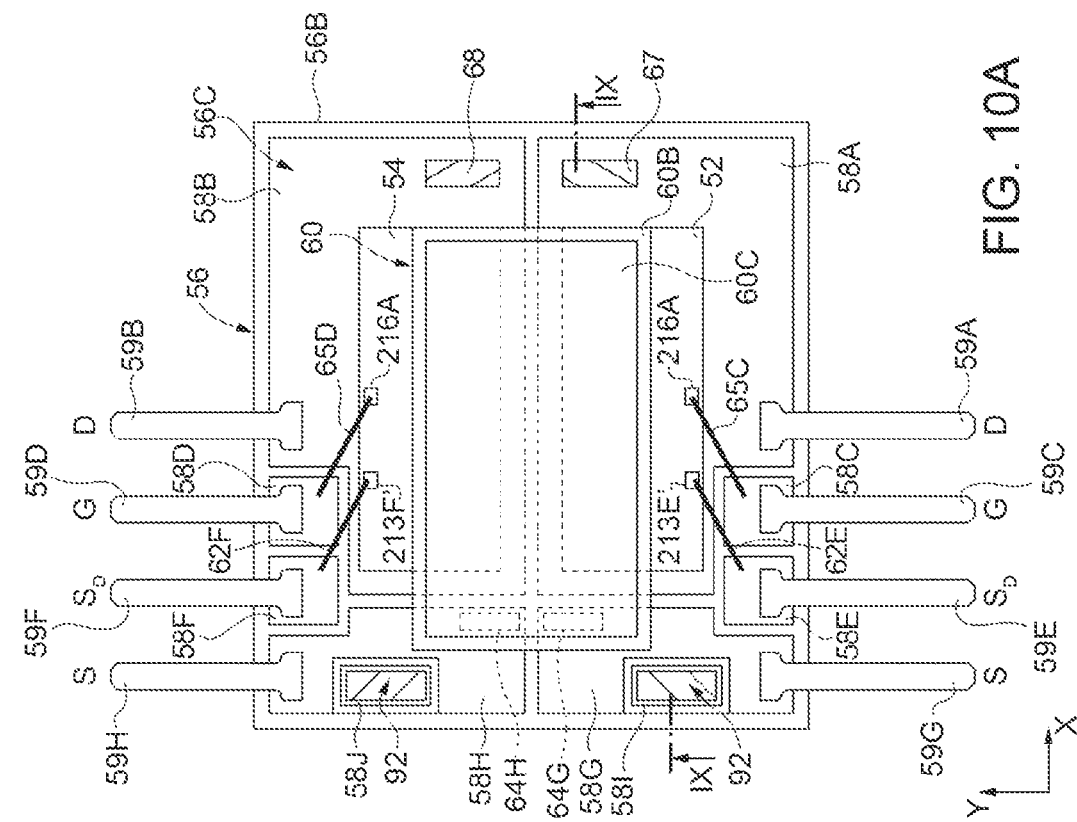
FIG. 10A
FIG. 10B

PACKAGED POWER ELECTRONIC DEVICE, IN PARTICULAR BRIDGE CIRCUIT COMPRISING POWER TRANSISTORS, AND ASSEMBLING PROCESS THEREOF

BACKGROUND

Technical Field

The present disclosure relates to a packaged power electronic device, in particular a circuit comprising power transistors, and assembling process thereof.

Description of the Related Art

For example, the circuit may comprise power devices operating at high voltage (even up to 600-700 V) with currents that may rapidly switch, such as silicon carbide or silicon devices, such as super-junction metal oxide semiconductor field-effect transistors (MOSFETs), insulated gate bipolar transistors (IGBTs) and the like.

For such circuits and power electronic devices, particular packages are desired, which allow a high heat dispersion. Such packages are generally formed by insulating rigid bodies, for example of resin, generally of parallelepiped shape, embedding the electronic component(s) as well as a dissipation structure arranged between the electronic component(s), facing the package surface and generally occupying most of a long base of a parallelepiped shape. The dissipation structure is sometimes formed by the same metal support (called "leadframe") which carries the die or dice integrating one or more electronic components and a plurality of leads for external connection. Generally, in this case, the leadframe has a surface arranged directly facing the outside of the package.

For example, in case of a packaged device comprising a MOSFET transistor, the die integrating the MOSFET transistor generally has a drain pad on a first larger surface and at least two contact pads (respectively, source pad and gate pad) on a second larger surface, opposite the first. A transistor contact pad (typically the drain pad) is attached to the leadframe supporting portion, which is in direct contact with one or more leads. The other contact pads (typically, the gate and source pads) are coupled to the other leads through bonding wires or clips. Such a standard package normally has the leads arranged on the same side of the dissipation structure and thus normally allows downward dissipation.

The present Applicant has further developed a package allowing upward cooling, due to an appropriate configuration of the lead and leadframe supporting portion. For example, FIG. 1 shows an integrated device 1 comprising two electronic components integrated in respective dice 2A, 2B, and embedded in a packaging insulating mass 3, of a generally parallelepiped shape, shown in phantom. The integrated device 1 comprises a leadframe 4 formed by a DBC (Direct Bonded Copper) multilayer, comprising a first metal conductive layer, an insulating layer, of ceramic, and a second metal conductive layer. One of the metal conductive layers (visible in FIG. 1) is shaped and forms two conductive portions 5A, 5B, electrically separated, forming respective supporting portions for the dice 2A, 2B and directly coupled to both respective gate pads (not visible) of the dice 2A, 2B, and to own leads 6. Other leads 7 are connected to the source and gate pads of the dice 2A, 2B, as well as to any other contact pads, through conductive regions 9 forming part of the leadframe 4 and possibly wires 8.

The conductive portions 5A, 5B and 9 are thermally coupled to, and electrically separated from, a thermally dissipative region 10 (FIG. 2A), facing outwards and level with the upper face of the packaging insulating mass 3.

With this type of package, different circuits and components topologies may be formed, as shown in FIGS. 3A-3I.

However, such a solution is not optimal in case of electronic devices formed by large components, such as high power and high switching current MOSFET transistors, and/or having different topologies.

For example, reference may be made to the full bridge circuit diagram of FIG. 4, indicated with 15 and formed by four MOSFET transistors 16-19, for example, N-channel. The MOSFET transistors 16-19 may be vertical-type power transistors, each integrated in an own die (similar to dice 2A and 2B of FIG. 1) having a drain electrode on a first face of the respective die and source and gate electrodes on an opposite face of the respective die.

In a per se known manner, two of the MOSFET transistors 16-19 (hereinafter referred to as first and second MOSFET transistors 16, 17) are reciprocally connected in series between a first and a second supply node 21, 22 and two other MOSFET transistors 16-19 (hereinafter referred to as third and fourth MOSFET transistors 18, 19) are reciprocally connected in series between the same supply terminals 21, 22. A first intermediate node 23 between the first and the second MOSFET transistors 16, 17 forms a first output terminal and a second intermediate node 24 between the third and the fourth MOSFET transistors 18, 19 forms a second output terminal.

In the illustrated example, the first and the third MOSFET transistors 16, 18 have drain terminals D coupled to each other and to the first supply node 21, source terminals S coupled to the first and, respectively, the second intermediate nodes 23, 24 and gate terminals G coupled to a first and, respectively, a third control terminal 25, 26. The second and fourth MOSFET transistors 17, 19 have source terminals S coupled to each other and to the second supply node 22, drain terminals D coupled to the first and, respectively, the second intermediate node 23, 24 and gate terminals G coupled to a second and, respectively, a fourth control terminal 27, 28.

Additionally, in the illustrated example, for a better on and off cycle control of the MOSFET transistors 16-19 so that the control voltage applied to the respective gate terminals is not referred to ground, the MOSFET transistors 16-19 each have a further source terminal SD, called driver source terminal 30-33, as described in detail, for example, in Italian patent application 102017000113926 and in U.S. patent application Ser. No. 16/154,411 (US 2019/0109225).

In the design of a packaged device integrating the bridge circuit 15, the supply nodes 21, 22, the intermediate nodes 23, 24, the control terminals 25-28 and the driver source terminals 30-33 are coupled to the outside through respective contact pads and respective leads. Hereinafter, then, reference will be indifferently made to terminals/nodes or contact pads 21-28 and 30-33, using the same reference numbers.

BRIEF SUMMARY

An aim of the present disclosure is to provide a package solution which overcomes at least some the drawbacks of the prior art.

According to the present disclosure, a packaged electronic device and an assembling process thereof are provided.

BRIEF DESCRIPTION OF THE SEVERAL VIEWS OF THE DRAWINGS

For a better understanding of the present disclosure, embodiments thereof are now described, purely by way of non-limiting example, with reference to the accompanying drawings, wherein:

FIGS. 10A and 10B are plan views of two parts of the device of FIG. 9, in an intermediate manufacturing step;

FIG. 13 is an exploded view of the packaged device of FIG. 9;

DETAILED DESCRIPTION

Figure 1:
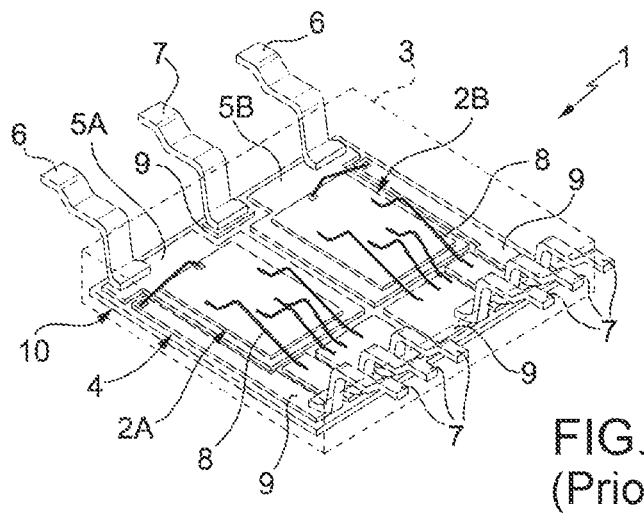
FIG. 1 is a perspective top views, with ghost parts, of a known packaged electronic device.
Figure 2A:
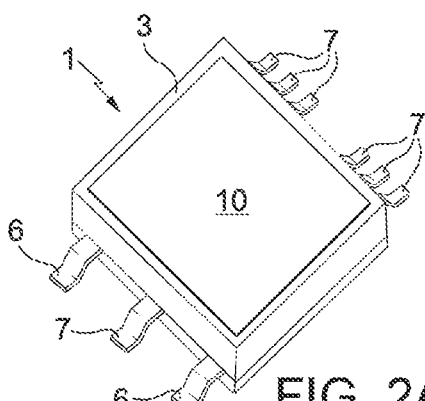
FIGS. 2A and 2B are perspective top views and, respectively, from below of the packaged electronic device of FIG. 1.
Figure 2B:
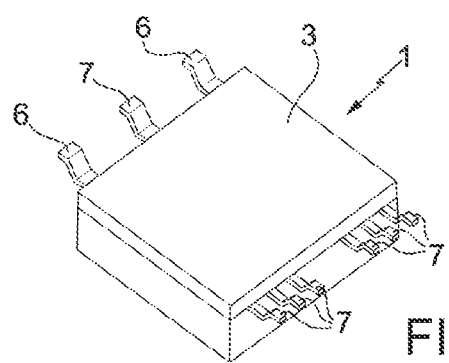
Figure 3A:
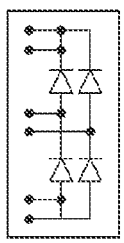
FIGS. 3A-3I show electric circuit topologies implementable as the packaged electronic device of FIG. 1.
Figure 3B:
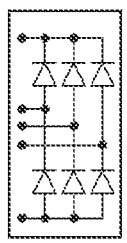
Figure 3C:
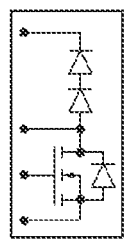
Figure 3D:
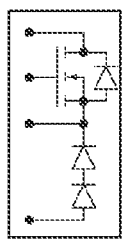
Figure 3E:
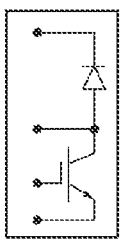
Figure 3F:
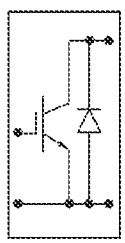
Figure 3G:
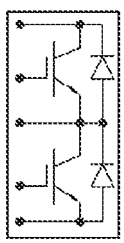
Figure 3H:
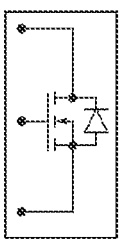
Figure 3I:
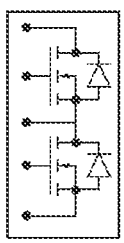
Figure 5:
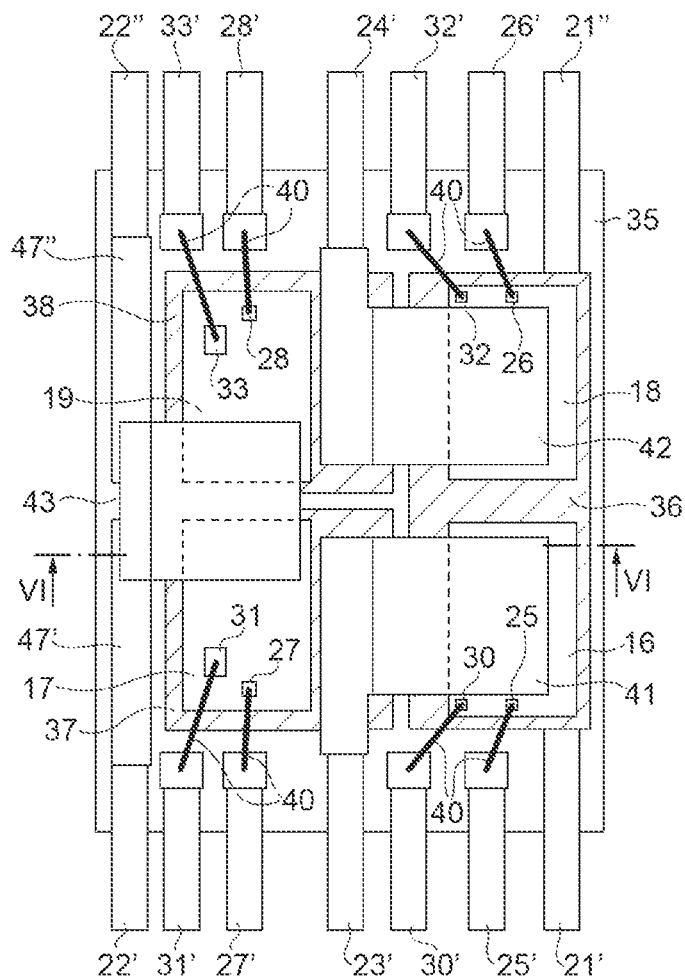
FIG. 5 is a top view of a possible implementation of the full bridge circuit of FIG. 4, formed similarly to the packaged electronic device of FIG. 1.

To use an upwardly cooling package similar to that of FIGS. 1, 2A and 2B, arranging the MOSFET transistors 16-19 in the manner shown in FIG. 5 is conceivable, wherein the MOSFET transistors 16-19 are carried by a leadframe 35 provided with leads. FIG. 5 also shows possible electric connections between the terminals/nodes 21-28 and 30-33 of the bridge circuit 15 and the leads. In FIG. 5, for sake of clarity, the leads are identified with the same reference numbers as the respective terminals/nodes of the bridge circuit 15 and are identified with a prime (leads 23'-28' and 30'-33'), except for the supply nodes 21, 22, each of which is coupled to two different leads 21', 21" respectively 22', 22"

In FIG. 5, the leadframe 35, formed as a DBC multilayer, comprises first, second, and third conductive regions 36, 37, and 38, arranged side by side but electrically insulated from each other, carrying the MOSFET transistors 16-19. In particular, the first conductive region 36 carries the first and the third MOSFET transistors 16, 18 arranged side by side and so that the respective drain terminals D are in contact with the first conductive region 36; the second conductive region 37 carries the second MOSFET transistor 17 so that its drain terminal D is in contact with the second conductive region 37; and the third conductive region 38 carries the fourth MOSFET transistor 19 so that its drain terminal D is in contact with the third conductive region 38.

The driver source pads 30-33 and gate pads 25-28 are arranged on upper surfaces of the MOSFET transistors 16-19, exposed through corresponding openings (not numbered) in respective passivation layers (also not numbered). Bonding wires 40 connect the driver source pads 30-33 and gate pads 25-28 to the respective leads 30'-33' and 25'-28'.

Figure 6:
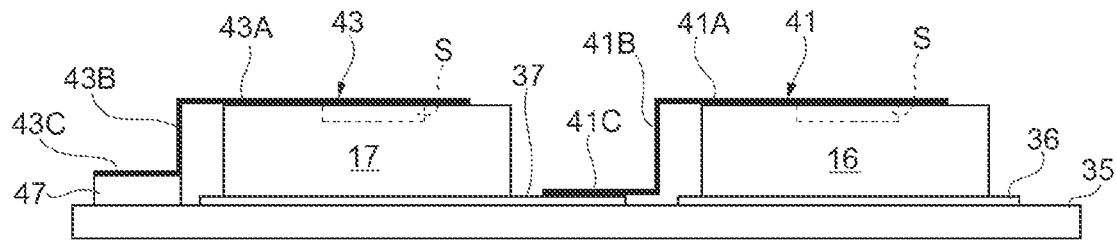
FIG. 6 shows a cross-section of the possible implementation of FIG. 5.

A first and a second clip 41, 42, L-shaped in a top view, couple source terminals S of the first and, respectively, the third MOSFET transistors 16, 18 to the second and, respectively, the third conductive regions 37, 38, coupled in turn to the leads 23' and, respectively, 24' and thus form the first and the second intermediate nodes 23, 24. Since, with the configuration shown, the MOSFET transistors 16-19 have source terminals S arranged on a different level with respect to the conductive regions 36-38, the first and the second clips 41, 42 have a non-planar shape, shown in the section of FIG. 6 with regards to the first clip 41. However, the same considerations also apply to the second clip 42.

In detail, the first clip 41 has a first horizontal portion 41A in contact with the source pad of the first MOSFET transistor 16. Additionally, the first clip 41 has a vertical portion 41B, which extends laterally to the first MOSFET transistor 16, insulated therefrom by an insulating layer, not shown, or by the passivation of the die integrating the MOSFET transistor 16; and a second horizontal portion 41C, which extends on the leadframe 35, bonded to the third conductive region 37 and to the lead 23'.

Figure 4:
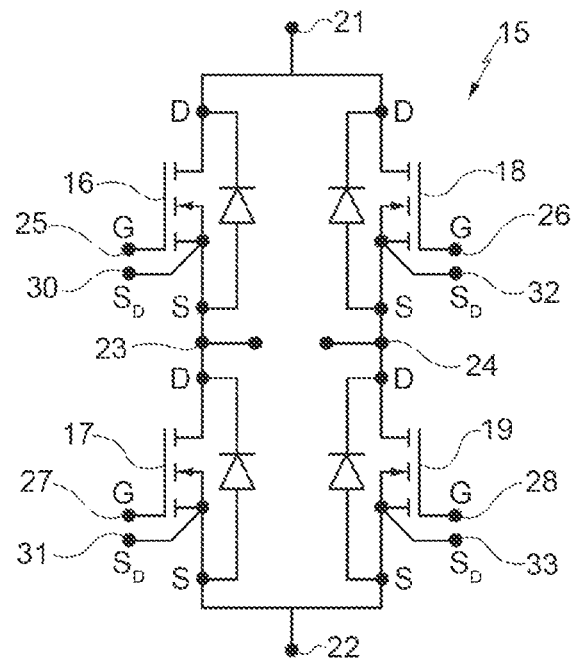
FIG. 4 shows a full bridge circuit of a known type.

Similarly, the third clip 43 couples the source terminals S of the second and the fourth MOSFET transistors 17, 19 (electrically connected to each other, FIG. 4) to the leads 22', 22" connected to the second supply node 22 of FIG. 5. To this end, see also FIG. 6, the third clip 43 has a first horizontal portion 43A extending over the upper surface of the second and the fourth MOSFET transistors 17, 19, in contact with the source pad thereof; a vertical portion 43B and a horizontal portion 43C bonded to the coupling regions 47', respectively 47" of conductive material, extending between the horizontal portion 43C and a respective lead 22', 22"

However, such a solution, while allowing for cooling from the top, would not be optimal.

In fact, as the size of the MOSFET transistors 16-19 increases, the packaged device (having the external shape shown in FIGS. 2A and 2B) would occupy a lot of space, and reach unacceptable overall size in some applications. Additionally, in case of high voltages and rapidly switchable currents, the thermal dissipation might not be sufficient.

Figure 7:
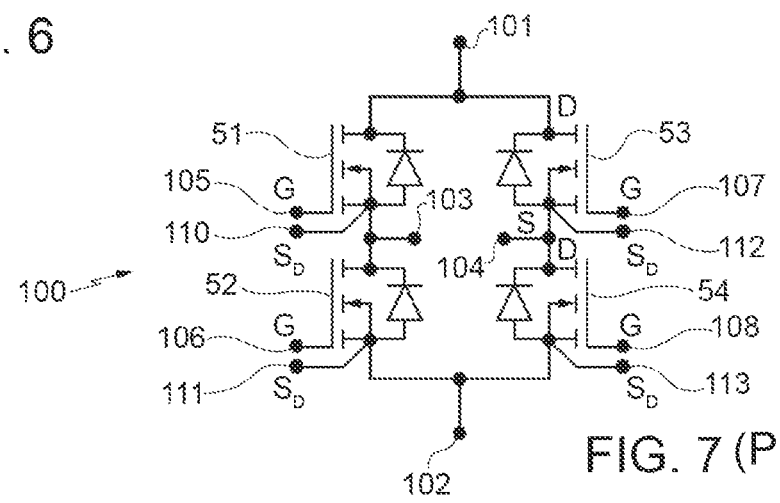
FIG. 7 shows a full bridge circuit of the type obtainable with the present device.

FIGS. 7-15D show a device 50 implementing a full bridge circuit 100, similar to the full bridge circuit 15 of FIG. 4 and represented again in FIG. 7 for sake of descriptive simplicity.

In detail, the device 50 comprises four integrated components, here four MOSFET transistors 51-54 and indicated below as first, second, third and fourth MOSFET transistors 51-54. Each MOSFET transistor 51-54 is integrated in an own die and may be made as shown in FIG. 8.

Figure 8:
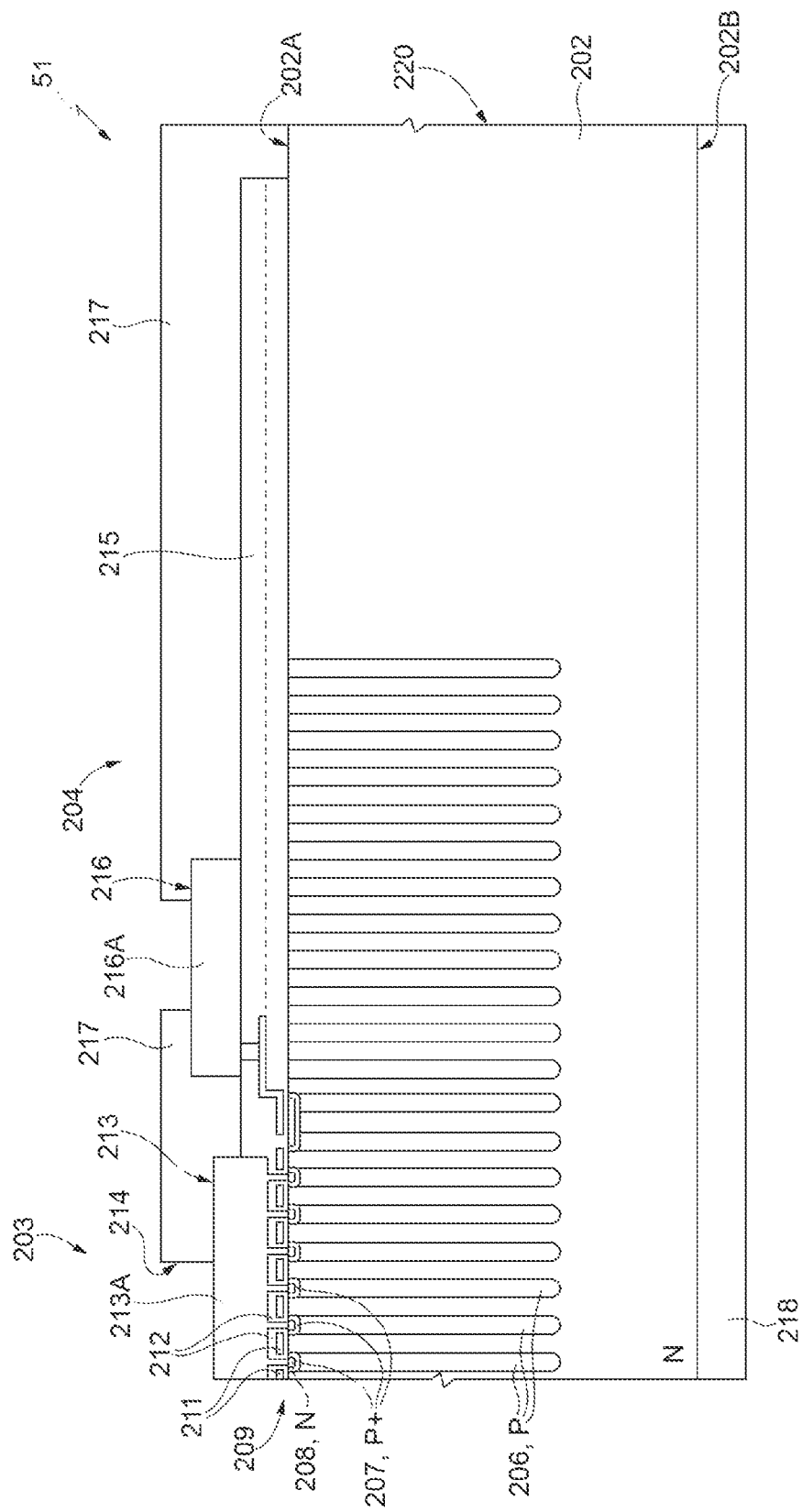
FIG. 8 shows a simplified cross-section of a portion of a die integrating a known power MOSFET device usable in the bridge circuit of FIG. 7.

In particular, FIG. 8 shows the structure of a charge-balancing (also called superjunction) MOSFET device, briefly described herein below for a better understanding.

With reference to FIG. 8 (wherein the various regions are not to scale, for clarity), the MOSFET transistor, here the first MOSFET transistor 51 (as well as the other MOSFET devices 52-54) is integrated in a die 220 comprising a body 202 of semiconductor material (typically silicon) having an upper surface 202A, a rear surface 202B and a first conductivity type, for example N. The body 202 defines an active zone 203 and an edge zone 204 and houses a plurality of pillars 206 of a second type of conductivity, here of P-type, among which N-type epitaxial layer zones extend. Body regions 207, here of P-type, extend from the upper surface 202A of the body 202 to the upper end of the pillars 206 arranged in the active zone 203 and accommodate source regions 208, of N-type.

Gate regions 211 extend above the upper surface 202A of the body 202, between pairs of adjacent pillars 206, that is in a laterally offset manner with respect to the source regions 208, electrically insulated from the body 202 and surrounded by an insulating region 212. A source metallization 213 extends above the active zone 203 of the body 202, over the gate regions 211 (but electrically insulated therefrom), and has contact portions extending towards the upper surface of the body 202, between pairs of adjacent gate regions 211, in direct electric contact with the source regions 208. Portions of the source metallization 213 (one visible in FIG. 8) are accessible from the outside through windows 214 and form source pads 213A for the external electric connection.

A gate metallization 216, electrically connected to the gate regions 211, extends on the dielectric layers 215 and forms a gate pad 216A for the external electric connection. An upper passivation layer 217 covers the dielectric layers 215, exposing the source pads 213A and the gate pads 216A. A drain metallization 218 extends on the rear surface 202B of the body 202, in direct electric contact with the body 202, covers the entire rear surface 202B and forms a drain terminal D of the MOSFET transistor 51.

Referring again to FIG. 7, the first and the second MOSFET transistors 51, 52 are reciprocally connected in series between a first and a second supply terminal 101, 102 of the bridge circuit 100; the third and the fourth MOSFET transistors 53, 54 are reciprocally connected in series between the same supply terminals 101, 102. A first intermediate node 103 between the first and the second MOSFET transistors 51, 52 forms a first output terminal and a second intermediate node 104 between the third and the fourth MOSFET transistors 53, 54 forms a second output terminal 104 of the bridge circuit 100.

In FIG. 7 the gate terminals of the MOSFET transistors 51-54 are further indicated with 105-108 and the driver source terminals of the MOSFET transistors 51-54 with 110-113.

FIGS. 9, 10A and 10B, 15A-15D show a possible implementation of the device 50. It should be noted that FIGS. 10A and 10B show two parts of the device 50 and the complete device 50 is obtained by flipping one over the other (for example, of the structure of FIG. 10B around a vertical axis of the drawing sheet, extending between the two FIGS. 10A, 10B). Hereinafter, additionally, the device 50 will be described with reference to the spatial position shown in FIG. 9, that is with a first greater surface 50A of the device 50 (generally of a parallelepiped shape) arranged facing downwards (and thus also defined below as the lower surface 50A) and with a second greater surface 50B arranged facing upwards (and thus also defined below as the upper surface 50B). The indications "upper," "lower," "high," "low" and the like therefore only refer to the spatial position of FIG. 9. The embodiment of FIGS. 9-15D, in particular, refers to a solution wherein the external connection leads project beyond the housing of the device 50 in the lower zone thereof, substantially aligned with the lower surface 50A.

Figure 9:
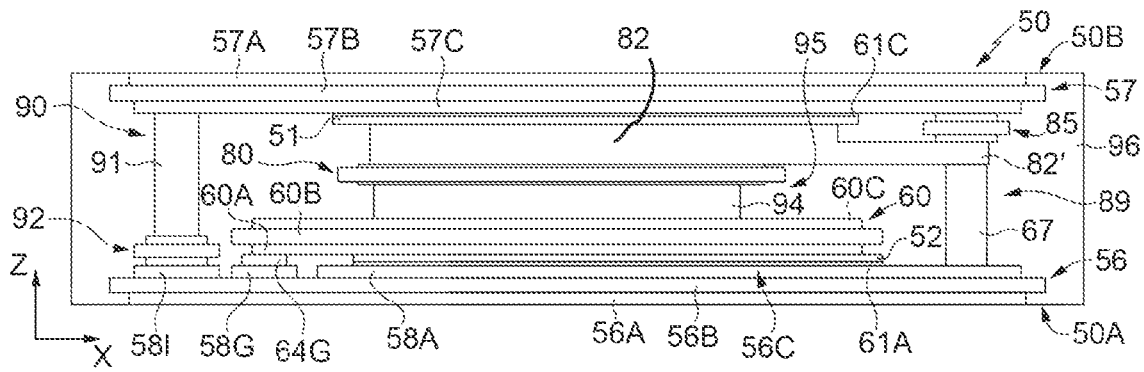
FIG. 9 is a cross-section of a possible implementation of the present packaged electronic device, taken along line IX-IX of FIG. 10A.

With reference to FIGS. 9, 10A and 10B, the MOSFET transistors 51-54 are arranged, two by two, on two overlapping levels. In the example considered, the first and third MOSFET transistors 51 and 53 (forming top transistors of the bridge circuit 100) are arranged reciprocally side by side, on an upper level, with the respective drain metallizations 218 facing upwardly. The second and fourth MOSFET transistors 52, 54 are arranged on a lower level, with the respective drain metallizations 218 arranged facing downwardly. The second and fourth MOSFET transistors 52, 54 are carried by a first support element 56; the first and the third MOSFET transistors 51 and 53 are carried by a second support element 57. In the cross-section of FIG. 9 only the first and the second MOSFET transistors 51, 52 are visible.

First and second alignment and spacing structures 89 and third and fourth alignment and spacing structures 90 extend between the first and the second support elements 56, 57, in proximity to opposite longitudinal ends thereof.

As shown in FIG. 13, the first support element 56 has a first face 56' coplanar with the first greater surface 50A of the device 50 and a second face 56"; the second support element 57 has a first face 57' coplanar with the second greater surface 50B of the device 50 and a second face 57".

As visible in FIG. 9, the first support element 56 is formed by a DBC (Direct Bonded Copper) multilayer comprising a stack formed by a first conductive layer 56A, typically of copper, a ceramic insulating layer 56B, typically of alumina, and a second conductive layer 56C, typically of copper. Similarly, the second support element 57 is formed by a DBC multilayer comprising a stack formed by a first conductive layer 57B, typically of copper, a ceramic insulating layer 57B, typically of alumina, and a second conductive layer 57C, typically of copper.

In FIG. 9, the first conductive layer 56A of the first support element 56 is arranged on the bottom and the second conductive layer 56C of the first support element 56 is arranged on the top, while the first conductive layer 57A of the second support element 57 is arranged on the top and the second conductive layer 57C of the second support element 57 is arranged on the bottom.

The MOSFET transistors 51, 53 are bonded to the second conductive layer 57C of the support element 57 through electrically conductive adhesive regions 61C, 61D and the MOSFET transistors 52, 54 are bonded to the second conductive layer 56C of the support element 56 through electrically conductive adhesive regions 61A, 61B (see also FIG. 13).

As visible in FIG. 10A, the second conductive layer 56C of the first support element 56 is shaped and forms ten separate conductive regions 58A-58J, forming two first drain conductive regions 58A, 58B, two first gate conductive regions 58C, 58D, two first driver source conductive regions 58E, 58F, two first source regions 58G, 58H and two insulated conductive regions 58I, 58J, as discussed in detail below. Respective output leads 59A-59H are bonded to the conductive regions 58A-58H, as explained in detail below.

In particular, the drain metallizations 218 of the second and fourth MOSFET transistors 52, 54 are bonded respectively to the two first drain conductive regions 58A, 58B. Similarly, the drain leads 59A, 59B, respectively forming the first and second output terminals 103, 104 of the bridge circuit 100, are also bonded respectively to the two first drain conductive regions 58A, 58B. Furthermore, a first and a second connection pillar 67, 68, of conductive material, for example of copper, extend from the first drain conductive regions 58A, 58B towards the second support element 57.

A first contacting element 60 extends above the second and the fourth MOSFET transistors 52, 54 and electrically connects the source pads 213A (FIG. 8) thereof to each other. The first contacting element 60, arranged straddling the second and the fourth MOSFET transistors 52, 54 and of a size such as to cover only part (for example, here about two thirds) of area thereof, FIG. 10A, is here also a DBC multilayer (also visible in FIG. 12) and comprises a stack formed by a first conductive layer 60A, typically of copper, an intermediate insulating layer 60B, for example, of ceramic, typically of alumina, and a second conductive layer 60C, typically of copper.

The first conductive layer 60A of the first contacting element 60 is arranged on the bottom and the second conductive layer 60C of the first contacting element 60 is arranged on the top. The first conductive layer 60A of the first contacting element 60 is in direct electric contact with the source pads 213A (FIG. 8) of the second and the fourth MOSFET transistors 52, 54, as shown in FIGS. 16-19 and described hereinafter.

The first contacting element 60 has a length (in a direction parallel to a first Cartesian axis X) greater than the second and the fourth MOSFET transistors 52, 54 and projects on a side (to the left in FIGS. 9 and 10A) thereto. The portion of the first conductive layer 60A projecting beyond the first and the third transistors 51, 53 is in direct electric contact with coupling regions 64G, 64H, dashed in FIG. 10A, each extending from a respective first source conductive region 58G, 58H and thus electrically coupled to first source leads 59G, 59H. In this manner, through the first conductive layer 60A of the first contacting element 60, the source regions 207 (FIG. 8) of the second and the fourth MOSFET transistors 52, 54 are electrically coupled to each other and to the first source leads 59G, 59H, and these form the second supply terminal 102 of the bridge circuit 100 (FIG. 7).

A further source pad 213E', not covered by the first contacting element 60 and visible in FIG. 10A, is connected, through a first driver source wire 62E to the first driver source conductive region 58E. Likewise, another further source pad 213F', also not covered by the first contacting element 60 and visible in FIG. 10A, is connected, through another first driver source wire 62F to the other first driver source conductive region 58F. First driver source leads 59E, 59F are bonded to the first driver source conductive regions 58E, 58F and form the driver source terminals 111, 113 of the bridge circuit 100 (FIG. 7).

The gate pads 216A of the second and the fourth MOSFET transistors 52, 54 also face the upper faces of transistors 52, 54, laterally to the first contacting element 60, and are connected through first gate wires 65C, 65D to the first gate conductive regions 58C, 58D. First gate leads 59C, 59D are bonded to the first gate conductive regions 58C, 58D and form the gate terminals 106, 108 of the bridge circuit 100 (FIG. 7).

As indicated above, the second support element 57 carries the first and the third MOSFET transistors 51, 53 (FIGS. 9 and 10B).

With particular reference to FIG. 10B, the first conductive layer 57A of the second support element 57 forms here five conductive regions 76A, 76C-76F (see also FIG. 13), including a single second drain conductive region 76A, two second gate conductive regions 76C, 76D and two second driver source conductive regions 76E, 76F. Output leads 77A-77F are bonded to the conductive regions 76A, 76C-76F, as explained in detail below.

Here, the drain metallizations 218 (FIG. 8) of both the first and the third MOSFET transistors 51, 53 are bonded directly to the second drain conductive region 76A and are then electrically coupled. Furthermore, second drain leads 77A, 77B are bonded to the second drain conductive region 76A and thus are electrically coupled to each other and form the first supply terminal 101 of the bridge circuit 100 (FIG. 7).

A second and a third contacting element 80, 81 are coupled to the first and the third MOSFET transistors 51, 53, respectively, and, in FIG. 9, extend below them. The second and the third contacting elements 80, 81 are arranged at the same level, side by side but electrically insulated, as explained below. In the embodiment of FIGS. 9, 10A, 10B, the second and the third contacting elements 80, 81, also of generally parallelepiped shape, elongated in the direction of the first Cartesian axis X, are offset in the width direction (parallel to a second Cartesian axis Y) with respect to the first contacting element 60, but are exactly superimposed in the length direction (parallel to the first Cartesian axis X), as visible in FIG. 9.

Figure 11:
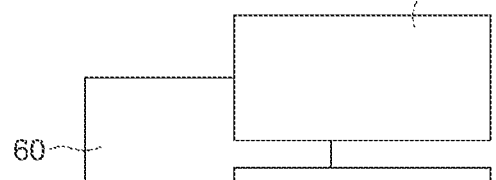
FIGS. 11 and 12 are respectively a plan view and a perspective view of a different embodiment of the reciprocal arrangement of some parts of the packaged device of FIG. 9.
Figure 12:
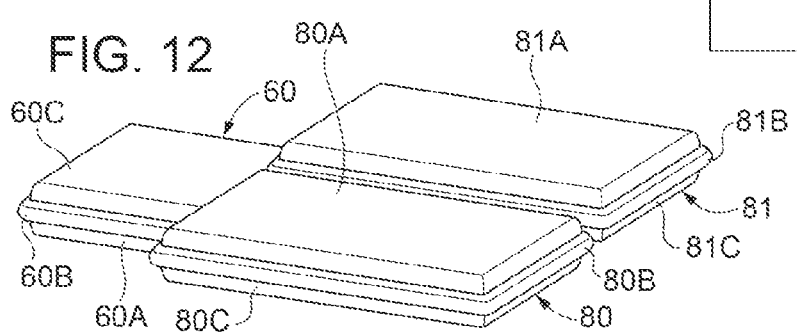

According to a different embodiment, shown in FIGS. 11 and 12, the second and the third contacting elements 80, 81 are offset with respect to the first contacting element 60 also in the length direction, symmetrically thereto.

The second and the third contacting elements 80, 81 are also formed here by DBC multilayers. In particular, the second and the third contacting elements 80, 81 comprise each a stack formed by a first conductive layer 80A, resp. 81A, typically of copper, an intermediate insulating layer 80B, resp. 81B, for example of ceramic, typically of alumina, and a second conductive layer 80C, resp. 81C, typically of copper. In FIG. 9, the first and the second conductive layers 80A, 81A, 80C, 81C have a smaller thickness than the corresponding conductive layers 60A, 60C of the first contacting element 60, since they do not have an electric conduction function but a thermal conduction function.

The first conductive layers 80A, 81A of the second and the third contacting elements 80, 81 are arranged on the top and the second conductive layers 80C, 81C of the second and third contacting elements 80, 81 are arranged on the bottom. The first conductive layer 80A of the second contacting element 80 is in direct electric contact with the source pads 213A (FIG. 8) of the first MOSFET transistor 51 through a first clip element 82. Likewise, the first conductive layer 81A of the third contacting element 81 is in direct electric contact with the source pads 213A (FIG. 8) of the third MOSFET transistor 53 through a second clip element 83.

In detail, FIG. 10B, the clip elements 82, 83 are formed by elongated regions (in a direction parallel to the first Cartesian axis X) of conductive material, such as copper. The first clip element 82 is arranged between the second contacting element 80 and the first MOSFET transistor 51. The first clip element 82 is longer than the first MOSFET transistor 51 so that a part 82' thereof (to the left in FIG. 10B and to the right in FIG. 9) projects laterally with respect to the MOSFET transistor 51. Likewise, the second clip element 83 is arranged between the third contacting element 81 and the third MOSFET transistor 53. The second clip element 83 is longer than the second MOSFET transistor 51 so that a part 83' thereof (to the left in FIG. 10B) projects laterally with respect to the MOSFET transistor 53.

The projecting portions 82', 83' of the clip elements 82, 83 extend as far as respective first and second connection pillars 67, 68, and are bonded and electrically connected thereto, respectively.

In this manner, the source terminals 213A of the first MOSFET transistor 51 are coupled, through the first clip element 82 and the first connection pillar 67, to the first drain conductive region 58A, to the drain lead 59A and thus to the first output terminal 103 of the bridge circuit 100 (FIG. 7) and the source terminals 213A of the third MOSFET transistor 53 are coupled, through the second clip element 83 and the second connection pillar 68, to the second drain conductive region 58B and to the drain lead 59B, and thus to the second output terminal 104 of the bridge circuit 100.

In the embodiment of FIG. 9, first supporting regions 85, formed by DBC substrates, are arranged between each clip element 82, 83 and the first, respectively the second support element 57.

The connection pillar 67 (shown dashed in FIG. 10B for clarity), projecting portion 82', and one of the first supporting regions 85 form the third alignment and spacing structure 89; and the connection pillar 68 (shown dashed in FIG. 10B), projecting portion 83', and the other one of the first supporting regions 85 form the fourth alignment and spacing structure 89.

Referring again to FIG. 10B, a further source pad 213E″ of the first MOSFET transistor 51, not covered by the second contacting element 80, is connected through a second driver source wire 87E to one of the second driver source conductive regions 76E. Similarly, another further source pad 213F″ of the first MOSFET transistor 53 not covered by the third contacting element 81, is connected through another second driver source wire 87F to the other one of the second driver source conductive regions 76F. Second driver source leads 77E, 77F are bonded to the second driver source conductive regions 76E, 76F and form the driver source terminals 110, 112 of the bridge circuit 100.

The gate pads 216A of the first and the third MOSFET transistors 51, 53 also face the upper faces of these transistors 51, 53, laterally to the second and, respectively, the third contacting element 80, 81 and are connected through second gate wires 87C, 87D to the second gate conductive regions 76C, 76D, respectively. Second gate leads 77C, 77D are bonded to the second gate conductive regions 76C, 76D and form the gate terminals 105, 107 of the bridge circuit 100.

The third and fourth alignment and spacing structures 90 extend between the first and the second support elements 56, 57 on sides opposite to those of the connection pillars 67, 68 with respect to the MOSFET transistors 51-54. For example, as shown in FIGS. 9, 10A and 10B, the third and fourth alignment and spacing structures 90 comprise each a carrier pillar 91 extending from the second drain conductive region 76A (FIG. 10B) on the second support element 57 towards the first support element 56 (downwardly in FIG. 9) and a second supporting region 92, formed on a respective insulated conductive region 58I, 58J. In the illustrated example, each second supporting region 92 is formed by a DBC multilayer.

A block 94 of thermally conductive material, for example of copper, extends between the second conductive layer 60C of the first contacting element 60 and the second conductive layers 80C, 81C of the second and third contacting elements 80, 81 (see also FIG. 13). The second conductive layers 60C, 80C, 81C are thus electrically and thermally connected to each other, but electrically insulated from the rest of the structure, due to the insulating intermediate layers 60B, 80B, 81B. In this manner, the assembly formed by the contacting elements 60, 80, 81 and the block 94 forms a thermal distribution structure 95 inside the device 50, capable of providing a smooth thermal distribution, without discontinuities, and avoiding localized heating zones.

A package mass 96 (FIG. 9) surrounds and incorporates the structure formed by the first support element 56, the second support element 57 and the alignment and spacing structures 89 and 90, level with the first conductive layers 56A and 57A of the support elements 56 and 57, thus forming the device 50.

In the device 50, since the first conductive layers 56A and 57A of the support elements 56 and 57 (in thermal contact with the drain metallizations 218 of the MOSFET transistors 51-54 through DBC multilayers, conducting heat well) are both exposed, the device 50 has dissipation surfaces on both sides and thus a high thermal dissipation capacity.

The alignment and spacing structures 89 and 90 provide in turn optimum thermal conduction paths, facilitating the heat transfer from the MOSFET transistors 51-54 inside the device 50 to the outside.

Figure 14A:
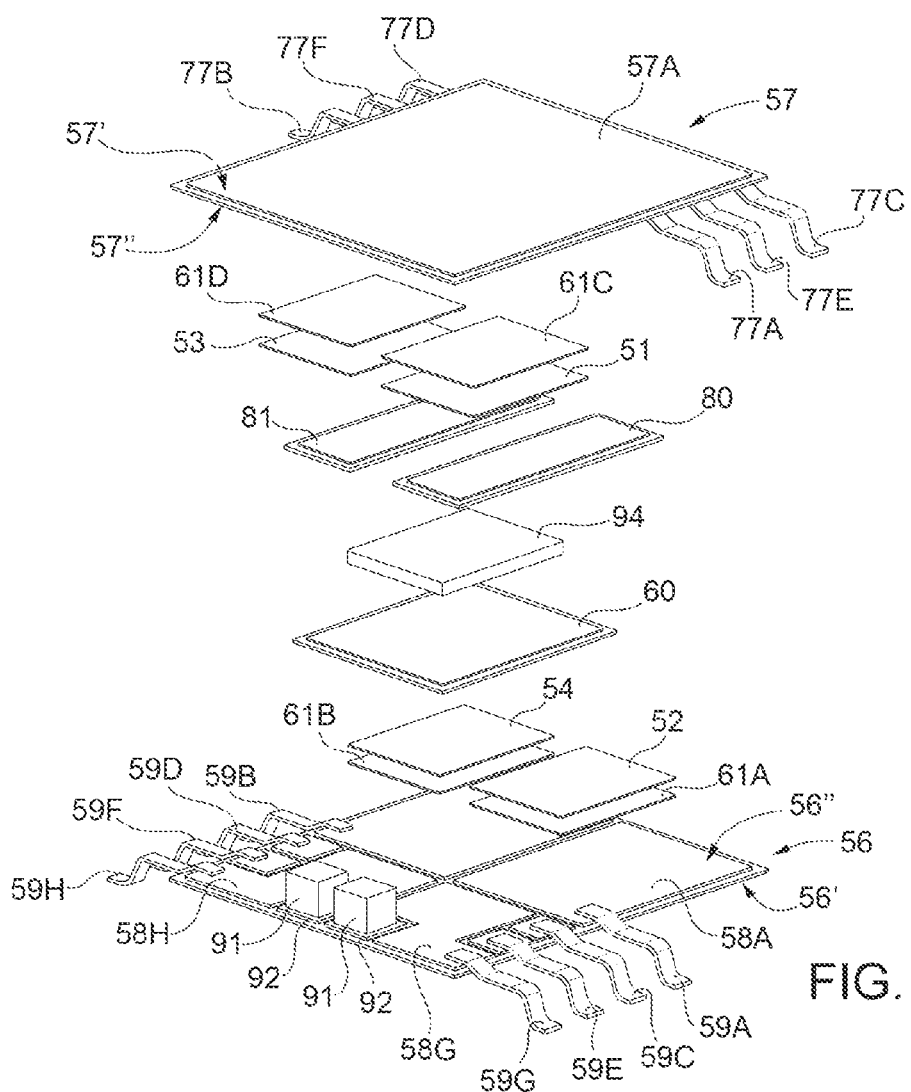
FIGS. 14A and 14B are perspective bottom and, respectively, top views of the packaged device of FIG. 9.
Figure 14B:
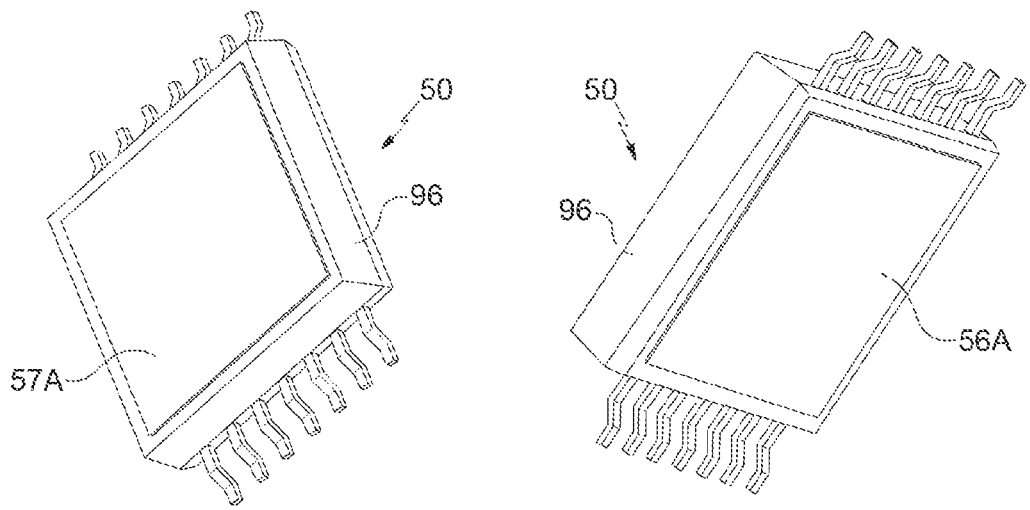
Figure 15A:
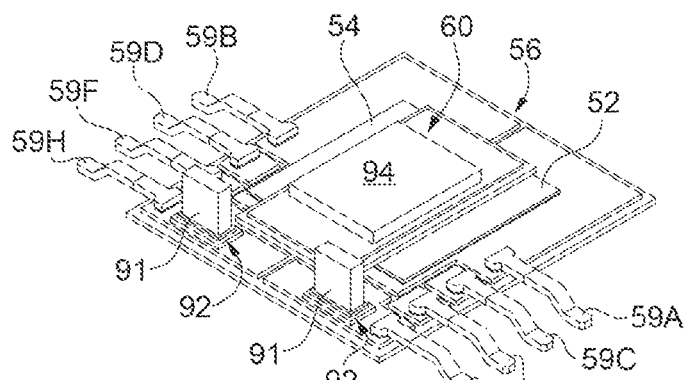
FIGS. 15A-15D are simplified perspective representations of parts of the device of FIG. 9.
Figure 15B:
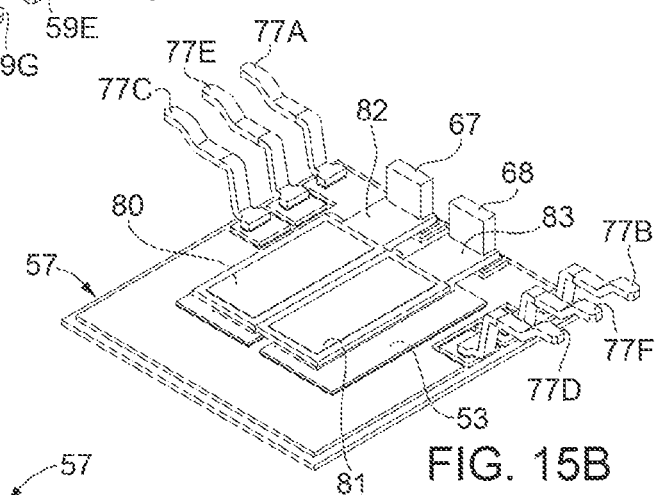
Figure 15C:
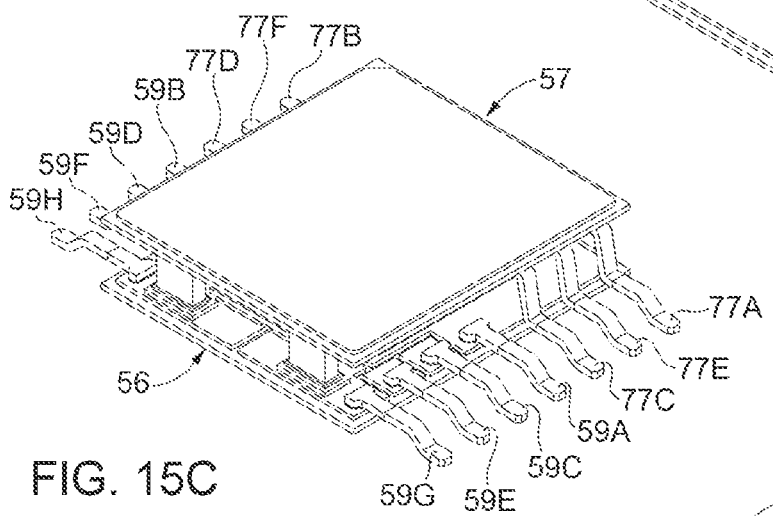
Figure 15D:
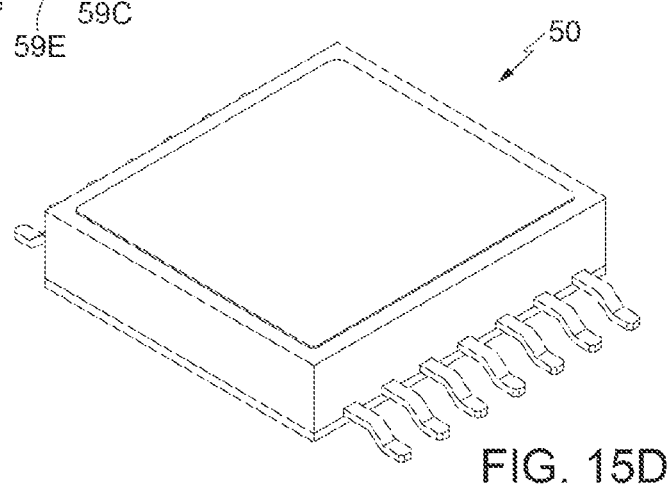

The structure is particularly compact, due to the two-level arrangement of the integrated electronic components, here the MOSFET transistors 51-54, as noted in particular in the views of FIGS. 14A, 14B.

The device 50 is assembled as described below. Initially the first and the second support elements 56, 57 are formed and the components thereof are bonded thereon.

In particular, and not necessarily in the order indicated, the first support element 56 is shaped to form, in the second conductive layer 56C, the conductive regions 58A-58J of FIG. 10A; the second and the third MOSFET transistors 52, 54 are bonded through the adhesive regions 61A, 61B; the leads 59A-59H are soldered; the wires 65C-65F are soldered; the second supporting regions 92 are attached and the carrier pillars 91 are grown.

Furthermore, and not necessarily in the order indicated, the second support element 57 is shaped to form, in the second conductive layer 57C, the conductive regions 76A-76F of FIG. 10B; the first and the second MOSFET transistors 51, 53 are bonded through the adhesive regions 61C, 61D; the leads 77A-77F are soldered; the wires 87C-87F are soldered; the first supporting regions 85 are bonded; the clip elements 82, 83 are attached; and the connection pillars 67, 68 are grown.

Simultaneously, earlier or later, the thermal distribution structure 95 (FIG. 9) is separately formed, by bonding the block 94 to the contacting elements 60, 80, 81. Alternatively to what indicated, the clip elements 82, 83 and the connection pillars 67, 68 may be formed as part of the thermal distribution structure 95, instead of being previously bonded to the first and the second MOSFET transistors 51, 53 and to the first supporting regions 85.

Then, in the considered assembling example, the first support element 56 (and the relative structures attached thereto), the second support element 57 (and the relative structures attached thereto) and the thermal distribution structure 95 are reciprocally attached, by bonding the carrier pillars 91 to the second supporting regions 92 and the connection pillars 67, 68 to the clip elements 82, 83.

Finally, the package mass 96 is formed, for example molded, in a per se known manner, so that the leads 59A-59H and 77A-77F project beyond the package mass 96.

A "heat sinker" (not shown) may be attached to the device 50 thus finished, on the side of the first and the third MOSFET transistors 51, 53 and the device 50 may be mounted on a carrier board (not shown), with the second and the fourth transistors 52, 54 arranged in proximity to the carrier board.

FIGS. 16-19 show details of the electric connection between the contact pads 213A.

Figure 16:
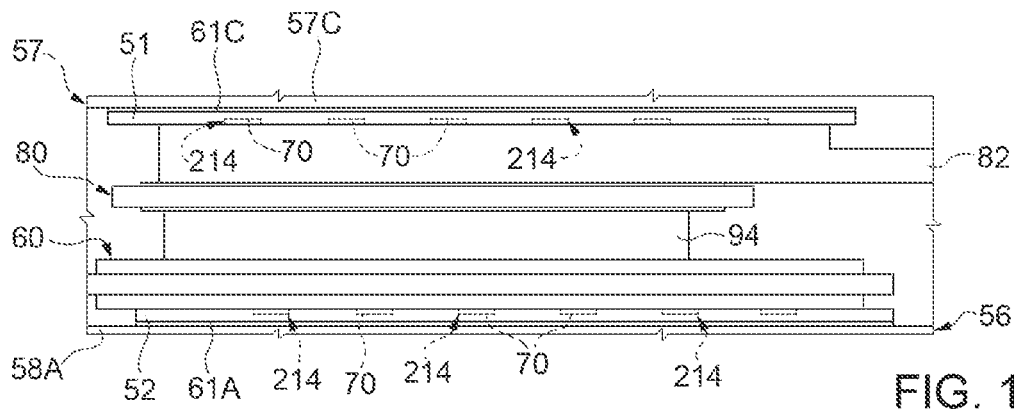
FIGS. 16-19 are cross-sections of different embodiments of a detail of the device of FIG. 9.

In FIG. 16, the source windows 214 on the source passivation 213 exposing the source pads 213A (FIG. 8) are represented with a dashed line. The windows 214 accommodate filling regions 70, of conductive material, which fill the source windows 214 and, before attaching the clip elements 82, 83 (only the first clip element 82 thereof being visible in FIG. 16), may slightly project beyond the source windows 214. In particular, the attachment of the clip elements 82, 83 is obtained through a soldering process, for example, by dispensing solder paste on the upper portion of the filling regions 70, (portion which is formed in a concave manner to avoid solder paste leakage), or by dispensing solder paste on the face of the clip elements 82 and 83 facing the first and the second MOSFET transistors 51, 53, in case the clip elements 82, 83 are previously bonded to the contacting elements 80, 81 to form the thermal distribution structure 95. In this case, the metal material of the clip elements 82, 83 and the first source regions 58G, 58H is in direct contact with the filling regions 70, forming the electric connection of the source regions 213.

Figure 17:
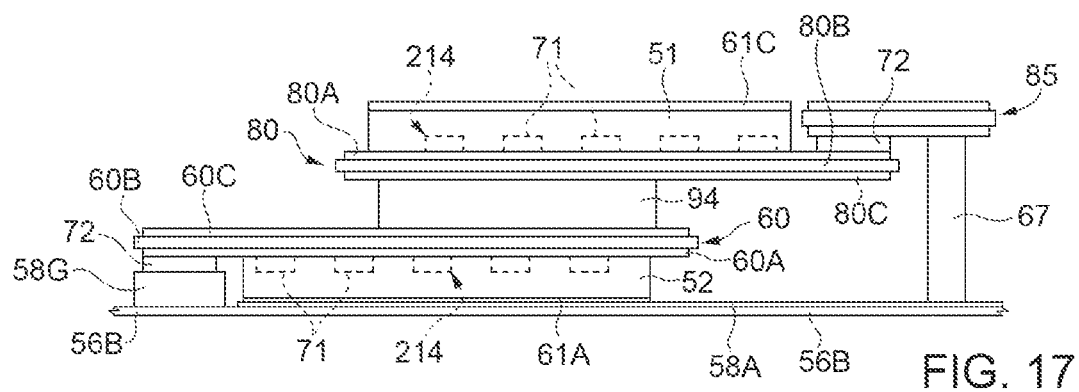

FIG. 17 shows the connection detail of the source pads 213A of the MOSFET transistors 51-54 using a contacting element also for the first and the third MOSFET transistors 51, 53. In this embodiment, therefore, there are no clip elements 82, 83, the first supporting regions 85 are formed wider, so as to extend beyond the second and the third contacting elements 80, 81, and the connection pillars 67, 68 (only the pillar 67 visible in FIG. 17) extend between the first support element 56 and the first supporting regions 85, whereto they are previously bonded during the manufacturing.

Additionally, in this embodiment, the first conductive layer 60A, 80A, 81A of the contacting elements 60, 80, 81 is shaped so as to form a plurality of projections 71, electrically connected, which enter the source windows 214 of the MOSFET transistors 51-54 (as visible in FIG. 17 for the first and the second MOSFET transistors 51, 52) and are bonded with the source pads 213A (FIG. 8), in direct electric contact.

In this solution, the first conductive layer 60A, 80A, 81A of the contacting elements 60, 80, 81 has a bulge 72 at the projecting portion thereof, where the first contacting element 60 is in electric contact with the coupling regions 64G, 64H and the second and the third contacting elements 80, 81 are bonded to the first supporting regions 85.

Additionally, here, the first and the second conductive layers 80A, 81A, 80C, 81C of the second and the third contacting elements 80, 81 have the same thickness as the first and the second conductive layers 60A, 61A of the first contacting element 60.

In this manner, in FIG. 17, the connection pillars 67, 68 form the electric contact above the intermediate insulating layer 80B, 81B, creating an electric continuity between the source metallizations 213 (FIG. 8) of the first and the third MOSFET transistors 51 and 53, through the source windows 214, the bulge 72, the connection pillars 67, 68, the first drain conductive regions 58A, 58B of the first support element 56, and the drain leads 59A, 59B.

Figure 18:
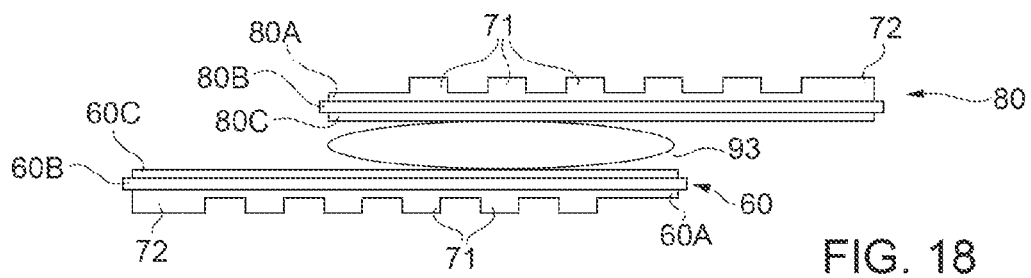

FIG. 18 shows a connection structure of the source pads 213A of the MOSFET transistors 51-54 similar to that of FIG. 17, wherein the first conductive layer 60A, 80A, 81A of all the contacting elements 60, 80, 81 is shaped to form the projections 71, but the block 94 is replaced by an adhesive mass 93, for example of solder.

Figure 19:
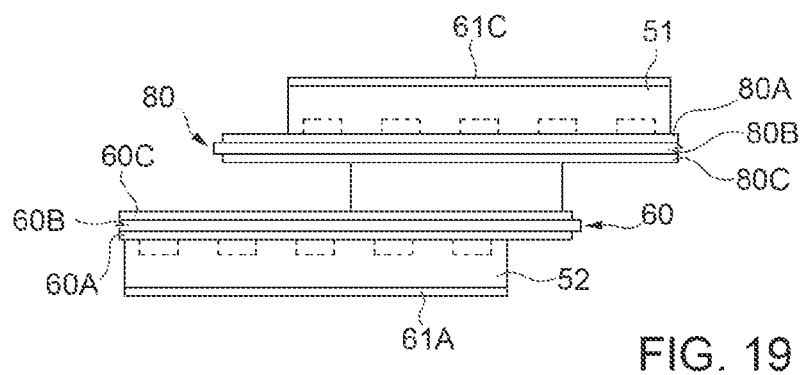

FIG. 19 shows a connection structure of the source pads 213A of the MOSFET transistors 51-54 without clip elements, the connections with the source metallizations 213 are formed directly by the contacting elements 60, 80, 81 (as in FIG. 18), but the first conductive layer 60A, 80A, 81A of none of the contacting elements 60, 80, 81 is shaped and is in contact with filling regions 70 formed in the source windows 214, as in FIG. 16.

Figure 20A:
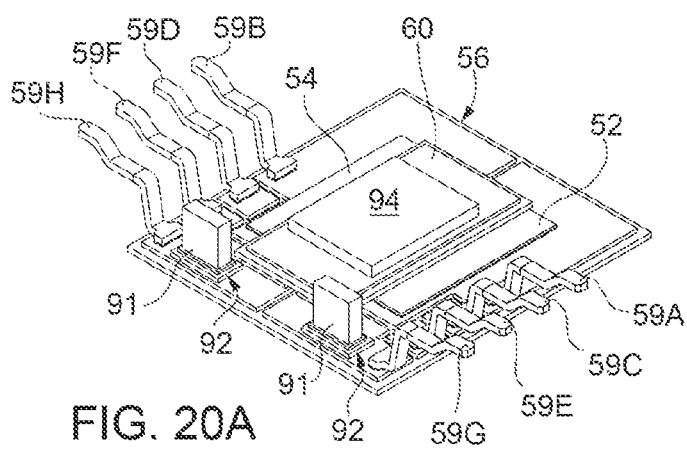
FIGS. 20A-20D are simplified perspective representations of parts of a different packaged electronic device, similar to FIGS. 15A-15D.
Figure 20B:
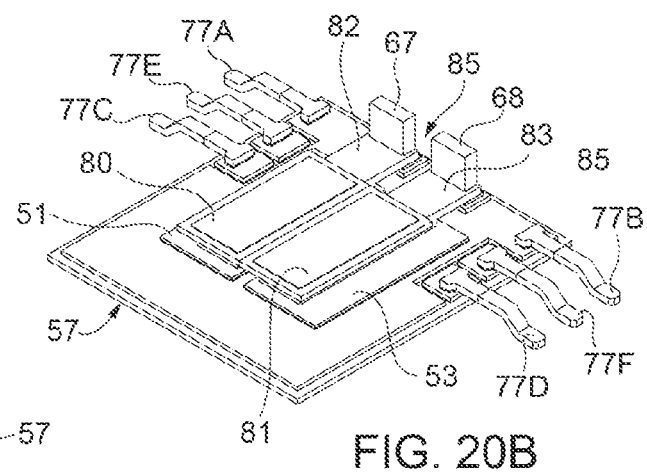
Figure 20C:
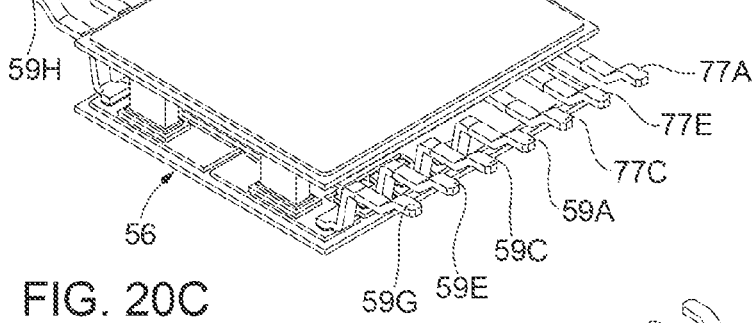
Figure 20D:
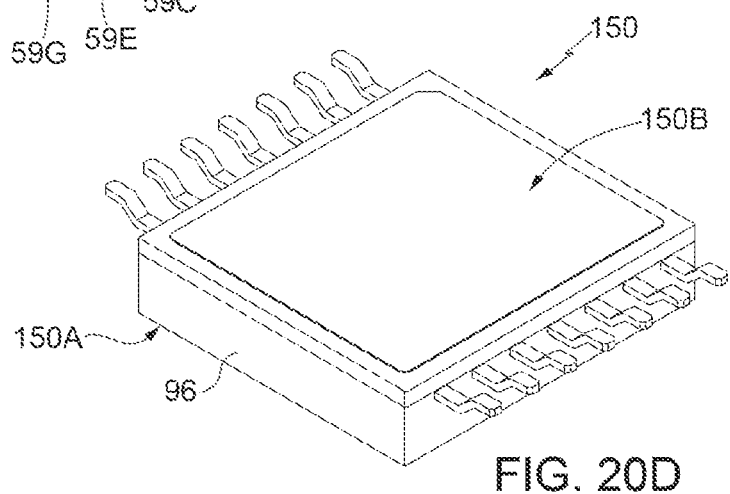

FIGS. 20A-20D show a different packaged electronic device, indicated with 150. The device 150 has a structure and components similar to those of the device 50 of FIGS. 9, 10A, 10B, and thus identified by the same reference numbers, except with regards to the leads 59A-59H and 77A-77F, which here project beyond the housing of the device 150 to the upper zone thereof, substantially aligned with the upper surface 150B (FIG. 20D). In this case, therefore, when the device 150 is mounted on a carrier board (not shown), the first and the third MOSFET transistors 51, 53 (upper transistors of the bridge circuit 100) will be arranged in proximity to the carrier board, while the second and the fourth transistors 52, 54 (lower transistors of the bridge circuit 100) will be arranged at a higher level with respect to the carrier board plane and may be in more direct thermal contact with any heat sinker possibly arranged on the device 150.

Finally, it is clear that modifications and variations may be made to the packaged electronic device and assembling process thereof described and illustrated herein without thereby departing from the scope of the present disclosure. For example, the different embodiments described may be combined so as to provide further solutions.

For example, what described above also applies to so-called "leadless" implementations, wherein the leads do not project to the outside, and only a minor portion thereof is not covered by the package mass 96 and is level with the housing, to allow the device 50 to be mounted with the "surface mounting" technique.

Additionally, a clip element might be provided in addition or alternatively between the source terminals of the second and the third transistors 52, 54 and the first contacting element.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
arranging first and second support elements, each having first and second faces and formed by an electrically insulating and thermally conductive multilayer;
bonding a first electronic component to the second face of the second support element, bonding a second electronic component to the second face of the first support element, bonding a third electronic component to the second face of the second support element, and bonding a fourth electronic component to the second face of the first support element, and the first electronic component is a first power transistor, the second electronic component is a second power transistor, the third electronic component is a third power transistor, and the fourth electronic component is a fourth power transistor;

bonding a first lead on the second face of the second support element and a second lead on the second face of the second support element;

forming a thermal distribution structure that includes first, second, and third contacting elements and an intermediate mass, the first, second, and third contacting elements each include an electrically insulating and thermally conductive multilayer, the first contacting element being arranged on a first side of the intermediate mass, the second contacting element being arranged on a second side of the intermediate mass, and the third contacting element being arranged on the second side of the intermediate mass and adjacent to and electrically insulated with respect to the second contacting element;

bonding the first contacting element of the thermal distribution structure to the second electronic component, bonding the second contacting element of the thermal distribution structure to the first electronic component, and bonding the third contacting element to the third power transistor and the fourth power transistor; and forming a packaging mass surrounding the thermal distribution structure and the first and the second support elements, the first face of the first support element forming a first thermal dissipation surface of a device and the first face of the second support element forming a second thermal dissipation surface of the device, and wherein bonding the third power transistor to the second surface of the second support element and bonding the fourth power transistor to the second surface of the first support element occurs before bonding the first and second contacting elements to the first and second electronic components.

2. The method according to claim 1, wherein arranging the first a second support elements comprises shaping the second faces of the first and second support elements to form electrically conductive regions.

3. The method of claim 1, further comprising:
coupling one or more first clips to the first support element; and
coupling one or more second clips to the second support element.

4. A method, comprising:
forming a first assembly including:
coupling a first MOSFET transistor to a first support element;
coupling a second MOSFET transistor to the first support element;
arranging a first contacting element to overlap the first MOSFET transistor and the second MOSFET transistor, the first contacting element straddling the first MOSFET transistor and the second MOSFET transistor; and
arranging a block of thermally conductive material on the first contacting element;
forming a second assembly including:
coupling a third MOSFET transistor to a second support element;
coupling a fourth MOSFET transistor to the second support element;
arranging a first clip element on the third MOSFET transistor;
arranging a second clip element on the fourth MOSFET transistor;
arranging a second contacting element on the first clip element; and
arranging a third contacting element on the second clip element;
coupling the first assembly to the second assembly includes stacking the second contacting element and the third contacting element onto the block of thermally conductive material.

5. The method of claim 4, wherein forming the first assembly further includes:
coupling a first carrier pillar to the first support element; and
coupling a second carrier pillar to the first support element, the second carrier pillar being spaced apart from the first carrier pillar.

6. The method of claim 5, wherein forming the second assembly further includes:
coupling a first connection pillar to the first clip element, the first connection pillar being spaced apart from the second contacting element; and
coupling a second connection pillar to the second clip element, the second connection pillar being spaced apart from the second contacting element.

7. The method of claim 6, wherein coupling the first assembly to the second assembly further includes contacting the first assembly with the first and second connection pillars and contacting the second assembly with the first and second carrier pillars.

8. The method of claim 4, further comprising:
coupling a plurality of first leads to a plurality of first conductive regions of the first support element; and
coupling a plurality of second leads to a plurality of second conductive regions of the second support element.

9. The method of claim 8, further comprising forming a packaging mass around the first assembly and the second assembly, and the plurality of first leads and the plurality of second leads extend outward from a plurality of sidewalls of the packaging mass.

10. The method of claim 8, wherein coupling the first assembly to the second assembly further includes first ends of the plurality of first leads being level with second ends of the plurality of second leads.

11. The method of claim 10, wherein the plurality of second leads are longer than the plurality of first leads.

12. The method of claim 10, wherein the plurality of first leads are longer than the plurality of second leads.

13. The method of claim 4, further comprising forming a packaging mass around the first assembly and the second assembly.

14. The method of claim 13, wherein forming the packaging mass around the first assembly and the second assembly further includes leaving a first surface of the first support element exposed from the packaging mass and leaving a second surface of the second support element exposed from the packaging mass.

15. The method of claim 14, wherein the first surface of the first support element is exposed from a first side of the packaging mass and the second surface of the second support element is exposed from a second side of the packaging mass opposite to the first side.

16. A method, comprising:
forming a first assembly including:
coupling a first MOSFET transistor to a first support element;
coupling a second MOSFET transistor to the first support element;

arranging a first contacting element to overlap the first MOSFET transistor and the second MOSFET transistor, the first contacting element straddling the first MOSFET transistor and the second MOSFET transistor; and arranging a block of thermally conductive material on the first contacting element;

forming a second assembly including:

coupling a first supporting region to a second support element;

coupling a second supporting region to the second support element, the second supporting region being spaced apart from the first supporting region;

coupling a third MOSFET transistor to the second support element;

coupling a fourth MOSFET transistor to the second support element;

arranging a first clip element on the third MOSFET transistor and on the first supporting region on the second support element, the first clip element extending laterally outward from a first end of the third MOSFET transistor;

arranging a second clip element on the fourth MOSFET transistor and on the second supporting region on the second support element, the second clip element extending laterally outward form a second end of the fourth MOSFET transistor;

arranging a second contacting element on the first clip element; and arranging a third contacting element on the second clip element;

coupling the first assembly to the second assembly includes stacking the second contacting element and the third contacting element onto the block of thermally conductive material.

17. The method of claim 16, wherein:

the first MOSFET transistor is spaced apart from the second MOSFET transistor and the first contacting element straddles the first MOSFET transistor and the second MOSFET transistor;

the third MOSFET transistor is spaced apart from the fourth MOSFET transistor; and the first clip element is spaced apart from the second clip element.

18. The method of claim 16, further comprising:

coupling a plurality of first leads to a plurality of first conductive regions of the first support element; and coupling a plurality of second leads to a plurality of second conductive regions of the second support element.

19. The method of claim 18, further comprising forming a packaging mass around the first assembly and the second assembly, and the plurality of first leads and the plurality of second leads extend outward from a plurality of sidewalls of the packaging mass.

20. The method of claim 16, further comprising forming a packaging mass around the first assembly and the second assembly.

* * * * *